United States Patent [19]

Koyanagi

[11] Patent Number: 4,891,326
[45] Date of Patent: Jan. 2, 1990

[54] SEMICONDUCTOR DEVICE AND A PROCESS FOR MANUFACTURING THE SAME

[75] Inventor: Mitsumasa Koyanagi, Higashimurayama, Japan

[73] Assignee: Hitachi, Ltd., Tokyo, Japan

[21] Appl. No.: 206,896

[22] Filed: Jun. 8, 1988

Related U.S. Application Data

[63] Continuation of Ser. No. 731,975, May 8, 1985, abandoned.

[30] Foreign Application Priority Data

May 16, 1984 [JP] Japan .................. 59-96462

[51] Int. Cl.⁴ .................. H01L 21/265; H01L 29/78
[52] U.S. Cl. .................. 437/29; 437/34; 437/40; 437/41; 437/44; 437/57; 357/23.9; 357/42
[58] Field of Search .................. 437/28, 29, 34, 40, 437/41, 44, 57; 357/23.9, 42

[56] References Cited

U.S. PATENT DOCUMENTS

| | | | |
|---|---|---|---|
| 4,366,613 | 1/1983 | Ogura et al. | 29/571 |
| 4,519,126 | 5/1985 | Hsu | 357/42 |
| 4,530,150 | 7/1985 | Shirato | 357/42 |

FOREIGN PATENT DOCUMENTS

192063  2/1983  Japan .................. 357/42

OTHER PUBLICATIONS

IEEE Transactions on Electron Devices, vol. ED-29, No. 4, Apr. 1982, Tsang et al.

*Primary Examiner*—Edward J. Wojciechowicz
*Attorney, Agent, or Firm*—Antonelli, Terry & Wands

[57] ABSTRACT

A process for fabricating a semiconductor device having n-channel and p-channel MOSFET's. Each MOSFET has a pair of side walls that are simultaneously formed on both sides of the gate electrode. The n-channel MOSFET has source and drain regions consisting of a low-concentration region formed by implanting ions using the gate electrode as a mask, and a high-concentration region formed by implanting ions using the gate electrode and side walls as masks. The p-channel MOSFET has source and drain regions consisting of high-concentration regions formed by implanting ions using the gate electrode and side walls as masks.

24 Claims, 2 Drawing Sheets

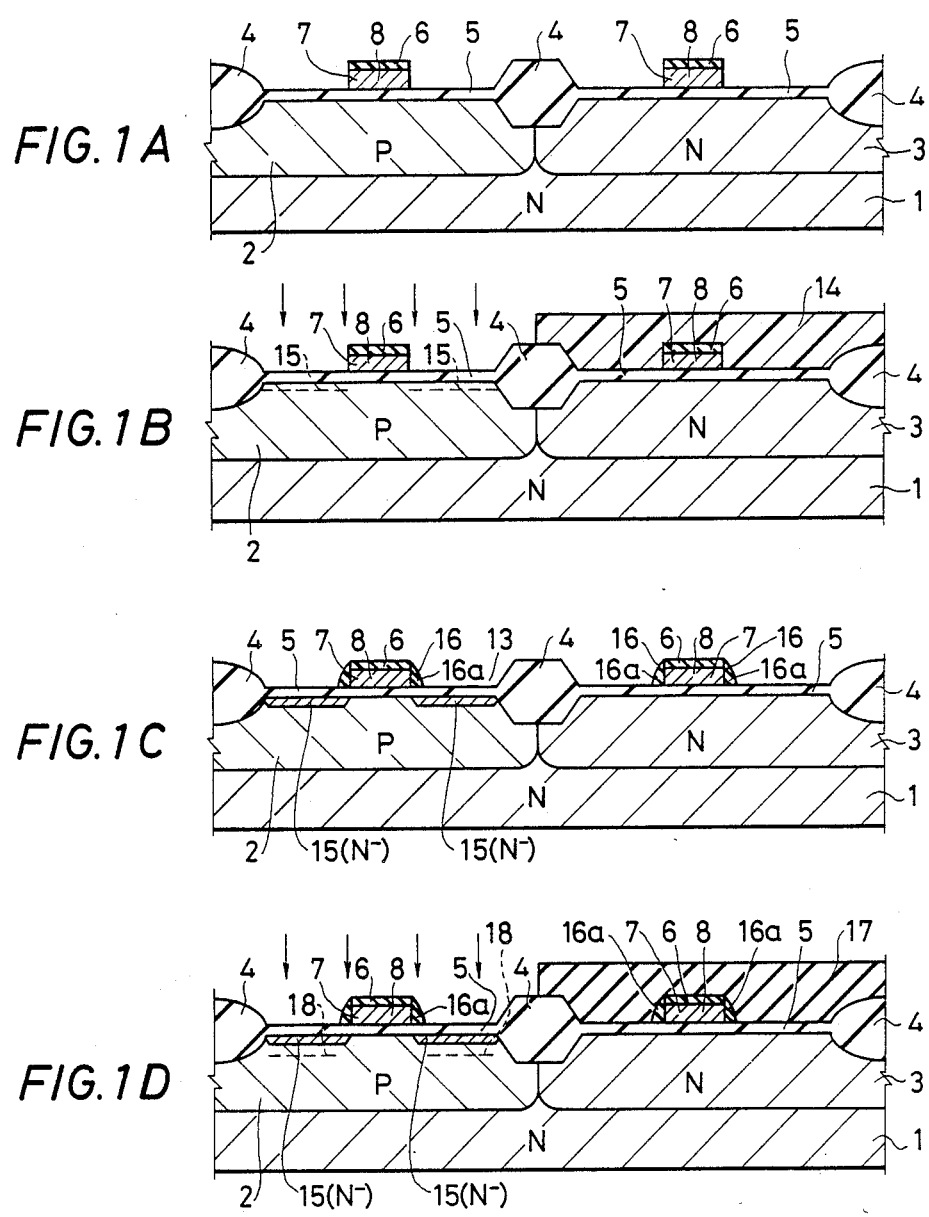

SEMICONDUCTOR DEVICE AND A PROCESS FOR MANUFACTURING THE SAME

This application is a continuation of application Ser. No. 731,975, filed May 8, 1985 now abandoned.

BACKGROUND OF THE INVENTION

The present invention relates to a semiconductor device comprising MISFETs that have good characteristics of threshold voltage ($V_{th}$) vs. channel length ($L_g$), and to a process for manufacturing the same.

In MOS devices, there is a tendency to reduce the channel length with a consequent increase in electric field intensity between the source region and the drain region. Therefore, hot carriers are injected into the gate oxide film to suppress these characteristics, as well as to suppress the $V_{th}$ vs. $L_g$ characteristics. To prevent these problems, some have proposed reducing the electric field intensity between the source region and the drain region relying upon a lightly doped drain (LDD) construction (see the journal, "Nikkei Electronics, a separate volume "Microdevices"", p. 83).

However, employment of the LDD construction makes it necessary to provide side walls and to carry out ion implantation before and after the formation of the side walls. Therefore, the devices which are produced require more manufacturing steps and higher manufacturing cost compared with the devices that are not of the LDD construction. Still further manufacturing steps will be required when LDD construction is adapted to CMOS devices.

Specifically, when LDD construction is adapted to CMOS devices, ion implantation must be carried out one more time on the p-channel metal oxide semiconductor field-effect transistor (P-MOSFET) and on an n-channel metal oxide semiconductor field-effect transistor (N-MOSFET), respectively. Therefore, the photoresist mask must be formed two more times compared with the conventional devices that are not of LDD construction. Therefore, the process is complicated in addition to the extra step for forming the side walls, and the manufacturing cost becomes expensive. It was further clarified by the inventors that the effective channel length becomes extremely short so as to suppress the $V_{th}$-$L_g$ characteristics.

SUMMARY OF THE INVENTION

The object of the present invention is to provide a semiconductor device which exhibits good characteristics of threshold voltage ($V_{th}$) vs. channel length ($L_g$), and which, when adapted to the CMOS devices, enables the manufacturing process to be simplified and the manufacturing cost to be reduced. The invention further provides a process for manufacturing the semiconductor devices.

The above and other objects as well as novel features of the present invention will become obvious from the description of the specification and the accompanying drawings.

A representative example of the invention disclosed in the specification will be briefly explained below.

The source and drain regions are so formed that the junction of a semiconductor layer is positioned close to both ends of a gate electrode, so that the effective channel length can be increased even when the gate is short, and so that the MOS device exhibits good $V_{th}$-$L_g$ characteristics.

Further, the source and drain regions are formed by implanting impurity ions after the side walls have been formed on both sides of the gate electrode. Therefore, CMOS devices can be manufactured through a simplified process and at reduced manufacturing costs.

BRIEF DESCRIPTION OF THE DRAWINGS

FIGS. 1A to 1F are section views illustrating the steps for manufacturing CMOS devices according to an embodiment of the present invention.

DESCRIPTION OF THE PREFERRED EMBODIMENT

Figure 1E:
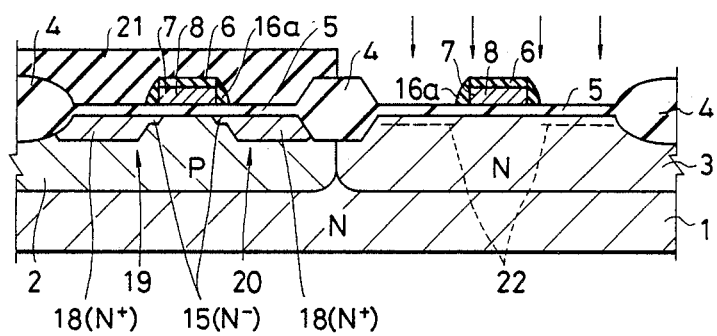

FIGS. 1A to 1F illustrate an embodiment in which the present invention is adapted to a CMOS device.

As shown in FIG. 1A, first, an n-type well 3 is formed by a conventional method on an n-type silicon semiconductor substrate 1; and then a p-type well 2 is formed. The substrate 1 has an impurity concentration of $5 \times 10^{14}$/cm$^3$, the p-type well 2 has an impurity concentration of $2 \times 10^{16}$/cm$^3$ with boron ions implanted and drive-in diffused, and the n-type well 3 has an impurity concentration of $4 \times 10^{16}$/cm$^3$ with phosphorus or arsenic ions implanted and drive-in diffused. A p-type single crystalline silicon having an impurity concentration of $1.5 \times 10^{15}$/cm$^3$ may be used as the substrate 1. As shown in FIG. 1A, furthermore, the substrate 1 is thermally oxidized to form a field oxide film 4 to define a region where the elements are to be formed. A p+-type channel stopper may be formed under the field oxide film 4 in the p-type well 2. A thin gate oxide film 5 which is a silicon oxide film is formed by thermally oxidizing the substrate 1 on the region where the elements are to be formed. A polycrystalline silicon layer 7 is formed by the CVD method on the gate oxide film 5, and is doped with impurities such as phosphorus ions to a high concentration to reduce the resistance thereof. Then, a phosphosilicate glass (PSG) film 6 is formed thereon by the CVD method. Next, the PSG film 6 and the polycrystalline silicon layer 7 are subjected to etching (patterning) relying upon a conventional step of photolighography using a photoresist, in order to form a gate electrode 8 consisting of polycrystalline silicon layer 7 the upper surface of which, is masked with the PSG film 6.

Then, as shown in FIG. 1B, a p-MOSFET-forming region (region other than n-MOSFET-forming region) is masked with a resist 14, and phosphorus ions are implanted into the n-MOSFET-forming region at a dose of $1 \times 10^{13}$/cm$^2$ and an energy of 60 KeV, to form a shallow ion-implanted layer 15 of a low concentration. After the resist 14 is removed, annealing is effected to obtain an n$^-$-type layer 15 having a surface concentration of about $1 \times 10^{18}$/cm$^3$.

An SiO$_2$ film 16 is formed by the CVD method on the whole surface of the substrate as shown in FIG. 1C, and is then subjected to etching over the whole surface thereof by reactive ion etching (RIE) with CHF$_3$ gas. The SiO$_2$ film 16 is left as side walls 16a on both sides of the gate electrode 8.

Referring to FIG. 1D, the p-MOSFET-forming region (n-type well 3) is masked with a resist 17 by photoetching, and arsenic ions are implanted onto the n-MOSFET-forming region (p-type well 2) at a dose of $7 \times 10^{15}$/cm$^2$, and an energy of 100 KeV to form a deep ion-implanted layer 18 of a high concentration. After the resist 17 is removed, an n+-type layer 18 is formed by annealing so as to have a surface concentration of $8 \times 10^{20}/cm^3$.

Thus, an n-MOSFET of LDD construction having a source region 19 and a drain region 20 is formed in the p-type well 2.

Figure 1F:
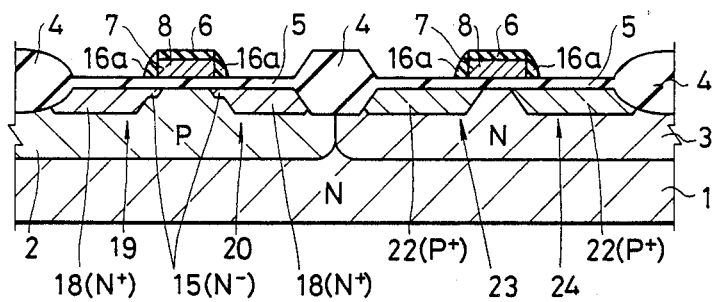

Then, the whole surface except the n-type well 3 is masked with a resist 21 as shown in FIG. 1E. With side walls 16a on the n-type well 3 as masks, boron ions are implanted at a dose of $2 \times 10^{15}/cm^2$ and an energy of 25 KeV to form a deep ion-implanted layer 22 having a high concentration. After the resist 21 is removed, a p+-type layer 22 is formed by annealing to have a surface concentration of $3 \times 10^{20}/cm^3$. Due to annealing, the junction of the p+-type layer 22 infiltrates into the under portion of the gate electrode 8 as shown in FIG. 1F, since boron ions have a high diffusion velocity. A source region 23 and a drain region 24 of a single diffused construction are thus formed having the effect of reducing the electric field intensity just like that of the LDD construction.

As described above, the source and drain regions 19, 20 of the n-MOSFET constituting the CMOS device comprise a shallow n−-type layer 15 and a deep n+-type layer 18 which is formed in an offset gate construction. Therefore, even when the channel is shortened, the electric field intensity between the source and the drain can be reduced, and characteristics can be prevented from being degraded by hot carriers. Therefore, an n-MOSFET having a high breakdown voltage is formed.

Further, by ion implantation after the side walls 16a have been formed, the source and drain regions 23, 24 of p-MOSFET of the other side constituting the CMOS device are formed into a single p+-type layer 22 (single drain construction), so that the junction at the end of the p+-type layer 22 will penetrate into the under portion of the gate electrode 8. Therefore, even if the gate length is reduced, the effective channel length can be increased provided the side walls 16a are very thick, making it possible to obtain a p-MOSFET having good $V_{th}$-$L_g$ characteristics Further, the LDD construction of the p-MOSFET is replaced by the p+-type layer 22 (single drain construction) only without having p−-type layer according to the embodiment of the present invention, by giving attention to the fact that when a p-MOSFET is realized in LDD construction, the difference in impurity concentration is very small at the ends of the p−-type layer and the p+-type layer that form source and drain regions, and that boron ions have a high diffusion velocity. Accordingly, the p-MOSFET of the embodiment of the present invention exhibits the effect of reducing the electric field intensity which is substantially equal to that of the p-MOSFET of LDD construction. Thus, the p-MOSFET of this embodiment exhibits good $V_{th}$-$L_g$ characteristics and has the effect of reducing the electric field intensity.

According to the present invention as described above, there is obtained a p-MOSFET having good $V_{th}$-$L_g$ characteristics that could not be obtained with a p-MOSFET of LDD construction.

According to the CMOS device of the above-mentioned embodiment, furthermore, the photolithography step that was required for the CMOS devices having p- and n-MOSFET's of LDD construction can be eliminated hence, manufacturing costs can be decreased. Furthermore, the CMOS device of the present invention contains a p-MOSFET having good $V_{th}$-$L_g$ characteristics.

In the present invention, the effects are obtained as mentioned below:

(1) By adapting the present invention to a CMOS device having n-MOSFET and p-MOSFET, it is possible to obtain an n-MOSFET and a p-MOSFET, both having good $V_{th}$-$L_g$ characteristics through a simple process and at a reduced cost.

(2) Even when the gate length is reduced, effective channel length can be increased by placing the junctions of the layer forming the source and drain regions at suitable positions close to both ends of the gate electrode, thereby to obtain good $V_{th}$-$L_g$ characteristics. In particular, even when the gate length is reduced, effective channel length can be increased by (increasing) the thickness of the side walls and permitting the junctions of an impurity layer that forms the source and drain regions to reach suitable positions close to both ends of the gate electrode, thereby obtaining good $V_{th}$-$L_g$ characteristics.

(3) When the present invention is adapted to the p-MOSFET, the effect mentioned in (1) above is obtained as well as the aforementioned effect of reducing the electric field intensity. These two effects are not obtained with a p-MOSFET of LDD construction. With the present invention, furthermore, a p-MOSFET is obtained through a simpler process than the process of producing a p-MOSFET of LDD construction, and at a lower cost.

(4) By adapting the present invention to the p-MOSFET of a CMOS device having side walls as will be understood from the foregoing description, the manufacturing process can be simplified and the manufacturing cost can be reduced.

In the foregoing the invention accomplished by the inventor by way of a particular embodiment was specifically described. The invention, however, is in no way limited to the above-mentioned embodiment only, but may be modified in a variety of other ways without departing from the gist of the invention.

For instance, the gate electrode may be composed of platinum or a high-melting metal, or silicides thereof, or may have a polycide structure in which platinum or a high-melting metal or a silicide thereof is formed on polycrystalline silicon.

In addition to a silicon oxide film, furthermore, the gate insulating film may be composed of any other insulating film (silicon nitride film or a film of a combination thereof). The present invention can further be adapted to MIS (metal insulated semiconductor) FET's.

Instead of the resist, furthermore, a silicon dioxide film or a silicon nitride film may be used as a masking material.

Further, the side wall may be made of any other insulating material, such as silicon nitride or the like, or may be made of a combination of silicon dioxide film and silicon nitride film.

The PSG film 6 need not necessarily be formed.

Further, it is not necessary to form a well region having the same type of conductivity as the substrate. Here, the substrate may have either n-type or p-type conductivity.

Instead of using a field oxide film, the element may be isolated by any other method, such as by burying an insulating material into grooves that are formed in the substrate by reactive ion etching (RIE) or the like.

It is also allowable to form a thin silicide layer of platinum or a high-melting metal on the surfaces of source and drain regions that are not covered by the side wall.

I claim:

1. A process for fabricating a semiconductor device having n-channel MISFET'S with source and drain regions each of LDD construction and p-channel MISFET'S with source and drain regions each of a single region, formed in a first semiconductor region having p-type conductivity and in a second semiconductor region having n-type conductivity, respectively, in a semiconductor substrate, comprising:

(a) a step of forming a gate electrode for each of said n-channel MISFET'S and p-channel MISFET'S, each said gate electrode having two sides, the gate electrode for each n-channel MISFET being formed over the first semiconductor region in said semiconductor substrate and the gate electrode for each p-channel MISFET being formed over the second semiconductor region in said semiconductor substrate;

(b) a step for forming first regions by introducing n-type impurities into the first semiconductor region, in which said n-channel MISFET'S will be formed, using said gate electrodes as masks;

(c) a step for forming a sidewall insulator on each of the sides of each of said gate electrodes of said n-channel MISFET'S and said p-channel MISFET'S;

(d) a step for forming second regions by introducing n-type impurities into the first semiconductor region, in which said n-channel MISFET'S will be formed, using said gate electrodes and said sidewall insulators as masks so as to form said second regions at both, sides of each said gate electrode for the n-channel MISFET'S, said second regions being deeper than said first regions and having a higher impurity concentration than said first regions, and said second regions forming a source region and a drain region of said n-channel MISFET'S together with said first regions, said first regions and said second regions forming said LDD construction; and (e) a step for forming third single p-type regions by introducing p-type impurities into the second semiconductor region, in which said p-channel MISFET'S will be formed, using said gate electrodes and said sidewall insulators as masks so as to form said third single p-type regions at both sides of each said gate electrode for the p-channel MISFET'S, said third regions being formed such that the ends thereof are located under the gate electrode, said third regions forming a source region and a drain of each said p-channel MISFET, whereby the source and drain regions of the p-channel MISFET'S are single p-type regions formed using the gate electrodes and sidewall insulators as masks.

2. A process for fabricating a semiconductor device according to claim 1, wherein the impurities for forming said third regions are boron ions.

3. A process for fabricating a semiconductor device according to claim 1, wherein said third regions are formed by implanting said impurities into said second semiconductor region followed by annealing.

4. A process for fabricating a semiconductor device according to claim 1, wherein the impurities for forming said first regions are phosphorus ions.

5. A process for fabricating a semiconductor device according to claim 1, wherein the impurities for forming said second regions are arsenic ions.

6. A process for fabricating a semiconductor device according to claim 1, where the first and second semiconductor regions are well regions of p-type conductivity and n-type conductivity, respectively.

7. A process for fabricating a semiconductor device according to claim 1, wherein the step for forming a sidewall insulator on each of the sides of each of the gate electrodes includes the sub-steps for forming an insulating layer on said gate electrodes, including both sides thereof, and on said semiconductor substrate, and etching said insulating layer by reactive ion etching so that a sidewall insulator is retained on each of the sides of each of said gate electrodes of the n-channel and p-channel MISFET'S.

8. A process for fabricating a semiconductor device according to claim 7, where in said insulating layer is a silicon oxide layer formed by chemical vapor deposition.

9. A process for fabricating a semiconductor device according to claim 7, wherein said first regions are formed by introducing n-type impurities at each, side of each of said gate electrodes for the n-channel MISFET'S using the gate electrodes as masks.

10. A process for fabricating a semiconductor device according to claim 9, wherein the p-type impurities for forming the third regions are boron ions.

11. A process for fabricating a semiconductor device according to claim 7, wherein the p-type impurities for forming the third regions are boron ions.

12. A process for fabricating a semiconductor device according to claim 11, wherein the step for forming third single p-type regions at both sides of each said gate electrode for the p-channel MISFET'S includes introducing boron impurities and then annealing so that the ends of said source and drain regions are located under the gate electrode, in the second semiconductor region.

13. A process for fabricating a semiconductor device according to claim 2, wherein said third regions are formed by implanting said boron ions into said second semiconductor region, followed by annealing.

14. A process for fabricating a semiconductor device according to claim 1, wherein the step for forming third single p-type regions at both sides of each said gate electrode for the p-channel MISFET'S includes introducing p-type impurities and then annealing so that the ends of said source and drain regions are located under the gate electrode, in the second semiconductor region.

15. A process for fabricating a semiconductor device according to claim 14, wherein the p-type impurities for forming the third regions are boron ions.

16. A process for fabricating a semiconductor device according to claim 1, wherein said first semiconductor region and said second semiconductor region are adjacent to each other in said semiconductor substrate.

17. A process for fabricating a semiconductor device according to claim 16, wherein an isolation region is provided between the first and second semiconductor regions, so as to isolate the n-channel MISFET'S formed in the first semiconductor region from the p-channel MISFET'S formed in the second semiconductor region.

18. A process for fabricating a semiconductor device according to claim 17, wherein said isolation region is a field oxide region provided on the semiconductor substrate.

19. A process for fabricating a semiconductor device according to claim 17, wherein the n-channel MISFET'S formed in the first semiconductor region and the p-channel MISFET'S formed in the second semiconductor region together form CMOS structure of said semiconductor device, whereby a CMOS semiconductor device is provided.

20. A process for fabricating a semiconductor device according to claim 19, wherein the step for forming third single p-type regions at both sides of each said gate electrode of the p-channel MISFET'S includes introducing p-type impurities and then annealing so that the ends of said source and drain regions are located under the gate electrode, in the second semiconductor region.

21. A process for fabricating a semiconductor device according to claim 20, wherein the p-type impurities for forming the third regions are boron ions.

22. A process for fabricating a semiconductor device according to claim 1, wherein the n-channel MISFET'S formed in the first semiconductor region and the p-channel MISFET'S formed in the second semiconductor region together form CMOS structure of said semiconductor device, whereby a CMOS semiconductor device is provided.

23. A process for fabricating a semiconductor device according to claim 22, wherein the step for forming third single p-type regions at both sides of each said gate electrode for the p-channel MISFET'S includes introducing p-type impurities and then annealing so that the ends of said source and drain regions are located under the gate electrode, in the second semiconductor region.

24. A process for fabricating a semiconductor device according to claim 23, wherein the p-type impurities for forming the third regions are boron ions.

* * * * *